US007016212B2

(12) United States Patent
Shibata et al.

(10) Patent No.: US 7,016,212 B2
(45) Date of Patent: Mar. 21, 2006

(54) MEMORY MODULE AND MEMORY SYSTEM SUITABLE FOR HIGH SPEED OPERATION

(75) Inventors: Kayoko Shibata, Tokyo (JP); Yoji Nishio, Tokyo (JP); Seiji Funaba, Tokyo (JP)

(73) Assignee: Elpida Memory Inc., (JP)

( * ) Notice: Subject to any disclaimer, the term of this patent is extended or adjusted under 35 U.S.C. 154(b) by 0 days.

(21) Appl. No.: 10/630,457

(22) Filed: Jul. 29, 2003

(65) Prior Publication Data
US 2004/0019758 A1 Jan. 29, 2004

(30) Foreign Application Priority Data
Jul. 29, 2002 (JP) .............................. 2002-220048

(51) Int. Cl.
*G11C 5/06* (2006.01)
(52) U.S. Cl. ...................... 365/63; 365/51; 365/189.03
(58) Field of Classification Search ................. 365/63, 365/51, 99, 104, 189.03, 220–221, 230.03, 365/233
See application file for complete search history.

(56) References Cited

U.S. PATENT DOCUMENTS

| 5,524,232 | A | * | 6/1996 | Hajeer ........................ 711/115 |
| 5,578,940 | A | * | 11/1996 | Dillon et al. ................. 326/30 |
| 6,411,539 | B1 | * | 6/2002 | Funaba et al. ................ 365/63 |
| 6,449,166 | B1 | * | 9/2002 | Sly et al. ..................... 361/760 |
| 6,480,409 | B1 | * | 11/2002 | Park et al. ..................... 365/63 |
| 6,522,165 | B1 | * | 2/2003 | Ramachandran et al. ..... 326/30 |
| 6,690,191 | B1 | * | 2/2004 | Wu et al. ...................... 326/30 |
| 6,711,027 | B1 | * | 3/2004 | McCall et al. .............. 361/783 |
| 6,754,132 | B1 | * | 6/2004 | Kyung ........................ 365/233 |

FOREIGN PATENT DOCUMENTS

| JP | 2001-084070 | 3/2001 |
| JP | 2002-023901 | 1/2002 |

\* cited by examiner

*Primary Examiner*—Richard Elms
*Assistant Examiner*—Dang T. Nguyen
(74) *Attorney, Agent, or Firm*—Ostrolenk, Faber, Gerb & Soffen, LLP (57) ABSTRACT

A memory module comprises a stab resistor between a pin and one end of a bus. A plurality of memory chips is connected to the bus between both ends thereof. A terminating resistor is connected to the other end of the bus. Stab resistance Rs of the stab resistor and terminating resistance Rterm of the terminating resistor are given by:

$Rs = (N-1) \times Zeffdimm/N$, and $Rterm = Zeffdimm$ where N represents the number of the memory modules in a memory system; and Zeffdimm, effective impedance of a memory chip arrangement portion consisting of the bus and the memory chips. In the memory system, the memory modules are connected to a memory controller on a motherboard in a stab connection style. Wiring impedance Zmb of the motherboard is given by:

$Zmb = (2N-1) \times Zeffdimm/N^2$.

12 Claims, 10 Drawing Sheets

MEMORY MODULE AND MEMORY SYSTEM SUITABLE FOR HIGH SPEED OPERATION

This application claims priority to prior application JP 2002-220048, the disclosure of which is incorporated herein by reference.

BACKGROUND OF THE INVENTION

This invention relates to a memory module and a memory system, particularly, to a memory system having a plurality of memory modules connected to a memory controller in a stab connection.

A related memory system comprises a plurality of memory modules and a memory controller for controlling the memory modules. The memory controller is mounted on a motherboard together with connectors for receiving the memory modules. The connectors are individually connected to the memory controller with motherboard transmission bus lines formed on the motherboard. Each of the memory modules is partially inserted into any one of the connectors to be controlled by the memory controller.

In the related memory system, the motherboard transmission bus lines are equal to the connectors in number. Accordingly, the memory system has a disadvantage that the transmission bus lines have a long total length and a complicated arrangement. Thus, this type of the memory system is difficult to design in a case where it has more connectors.

Another related memory system having a plurality of memory modules called RIMM (Rambus Inline Memory Module) has no branching between the memory modules and a memory controller for controlling the memory modules. That is, the memory modules are connected to one another in serial by motherboard transmission bus lines. Therefore, the memory system does not have the above-mentioned disadvantage of the complicated arrangement.

However, the memory system has another disadvantage that the motherboard transmission bus lines have narrow bus width.

SUMMARY OF THE INVENTION

It is therefore an object of this invention to provide a memory module capable of simplifying wiring of a motherboard for a memory system.

Another object of this invention to provide a memory system suitable for a high speed operation.

Other objects of this invention will become clear as the description proceeds.

According to a first aspect of this invention, a memory module can be inserted in any one of connectors formed on a motherboard. The memory module comprises a memory chip. A pin is connectable to the connector. A bus connects the memory chip to the pin. A terminating resistor is connected to one end of the bus. A stab resistor is connected between the pin and the other end of the bus.

In a case where the connectors are connected to a memory controller in a stab connection, the stab resistor and the terminating resistor have stab resistance Rs and terminating resistance Rterm, respectively. The stab resistance Rs and the terminating resistance Rterm are given by:

$Rs=(N-1) \times Zeffdimm/N$, and $Rterm=Zeffdimm$ where N represents the number of the connectors; and Zeffdimm, effective impedance of a memory chip arrangement portion consisting of the bus and the memory chip.

According to a second aspect of this invention, a memory system includes a plurality of memory modules inserted in connectors formed on a motherboard. Each of the memory module comprises a memory chip. A pin is connected to one of the connectors. A bus connects the memory chip to the pin. A terminating resistor is connected to one end of the bus. A stab resistor is connected between the pin and the other end of the bus.

In the memory system, the connectors are connected to a memory controller in a stab connection. The stab resistor and the terminating resistor have stab resistance Rs and terminating resistance Rterm, respectively. The stab resistance Rs and the terminating resistance Rterm are given by:

$Rs=(N-1) \times Zeffdimm/N$, and $Rterm=Zeffdimm$ where N represents the number of the memory modules; and Zeffdimm, effective impedance of a memory chip arrangement portion consisting of the bus and the memory chip. The mother board has wiring impedance Zmb represented by:

$Zmb=(2N-1) \times Zeffdimm$.

DESCRIPTION OF THE PREFERRED EMBODIMENT

Figure 1:
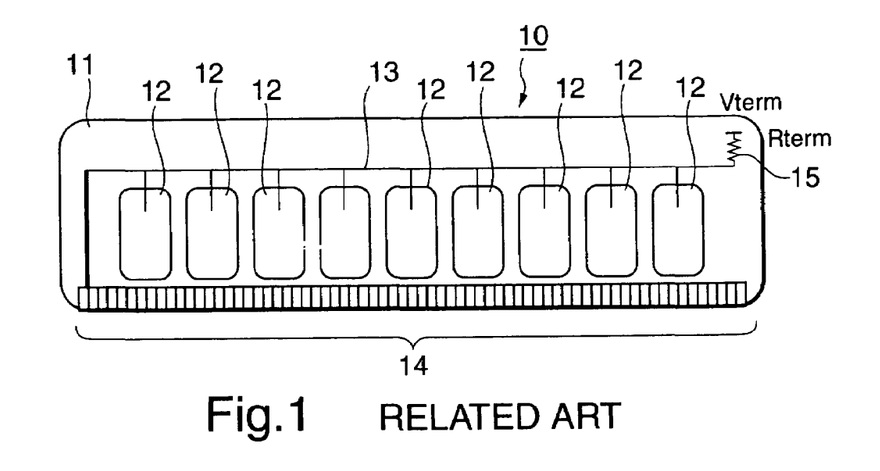
FIG. 1 is a schematic diagram of a related memory module.
Figure 2:
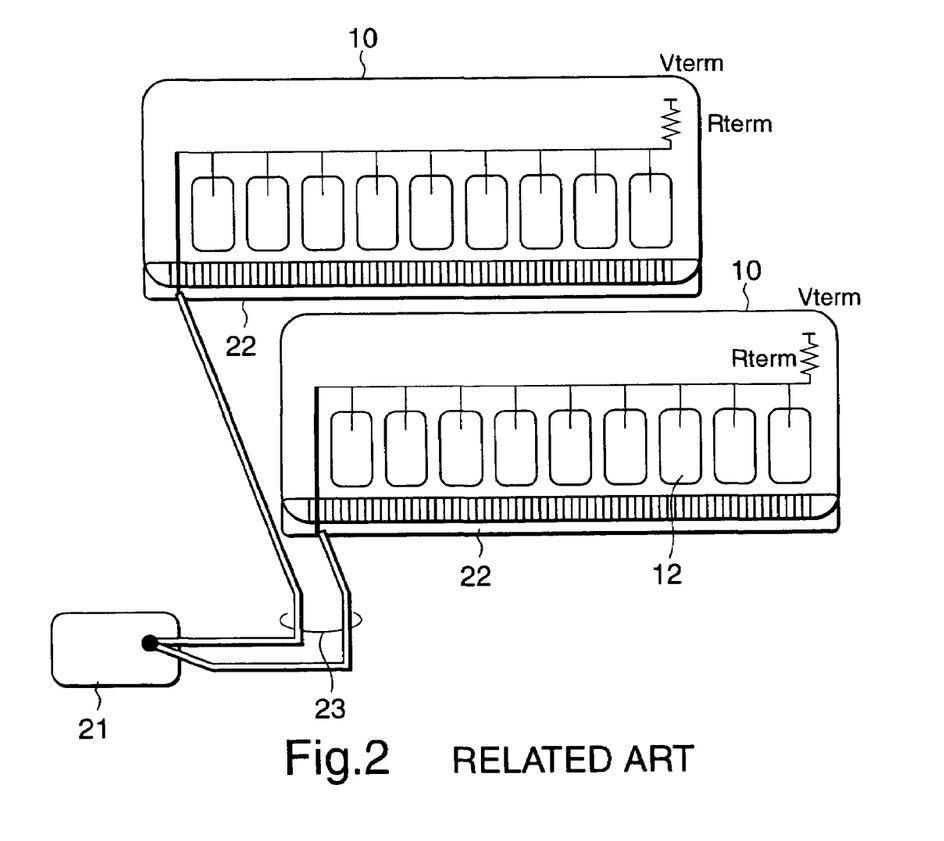
FIG. 2 is a schematic diagram of a memory system using two of the memory modules of FIG. 1.

Referring to FIGS. 1 and 2, description will be at first directed to a related memory module and a related memory system using the memory module for a better understanding of this invention.

FIG. 1 is a schematic front view of a related memory module 10. The memory module 10 comprises a memory board 11, a plurality of memory chips 12, a module transmission bus line 13, a plurality of pins 14, and a terminating resistor (Rterm) 15.

The memory board 11 is a printed circuit board. The memory chips 12 are mounted on the memory board 11 and arranged at regular intervals. The module transmission bus line 13 is formed on the memory board 11 to connect the memory chips 12 to specific one of the pins 14 in common. That is, the specific pin is connected to an end of the module transmission bus line 13. The pins 14 are connectable to terminals of a connector mounted on a motherboard. The terminating resistor 15 is connected to the other end of the module transmission bus line 13 at one end thereof and supplied with a predetermined voltage level of Vterm at the other end thereof.

The memory module 10 is a DIMM (Dual Inline Memory Module) and has a rear side with the same structure as the front side shown in FIG. 1.

FIG. 2 shows a memory system including two of the memory modules 10 of FIG. 1.

In FIG. 2, the memory system comprises a memory controller 21 mounted on a motherboard (not shown). A plurality of connectors 22 are mounted on the motherboard and connected to the memory controller 21 with respective motherboard transmission bus lines 23 formed on the motherboard. Such a memory system is disclosed in Japanese Unexamined Patent Publication No. 2002-23901.

The structure of FIG. 2 needs the same number of the motherboard transmission bus lines 23 as the connectors 22. This is because the connectors 22 are individually connected to the memory controller 21 with the motherboard transmission bus lines 23 as mentioned above. Accordingly, the total length of the motherboard transmission bus lines 23 becomes large in roughly proportion to the number of the connectors 22. Furthermore, it becomes difficult to arrange the motherboard transmission bus lines 23 with increase of the total length thereof. Thus, it is hard to design a memory system having more connectors (and memory modules).

In another related memory system having a plurality of memory modules called RIMM (Rambus Inline Memory Module), the memory modules are connected to each other by memory transmission bus lines without branching. Therefore, the memory system does not have the above-mentioned disadvantage. However, the memory system has another disadvantage that the motherboard transmission bus lines have narrow bus width.

If the memory modules as shown in FIG. 1 are connected to the memory controller with a common transmission bus line in a stab connection, the memory system has a simple arrangement of wiring. In addition, it is possible to widen bus width of the common transmission bus line.

However, the stab connection has some or many branch points. Accordingly, it is easy to cause reflection of a transmission signal at each of the branch points on the common transmission bus line. The reflected signals become considerable when a transmission rate of the transmission signal becomes high. Thus, the stab connection limits an operation speed of the memory system using the memory modules as shown in FIG. 1.

Figure 3:
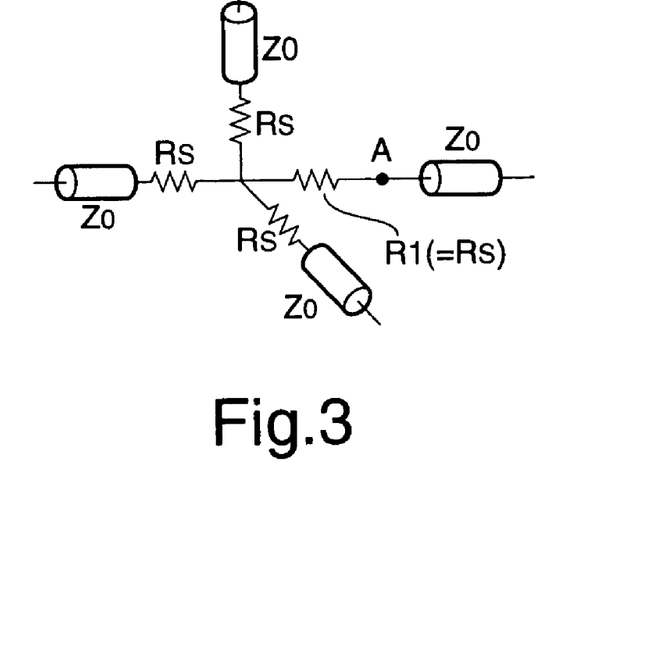
FIG. 3 is an equivalent circuit diagram for describing a condition that signal reflection does not occur on a star connection.

Referring to FIG. 3, a description follows about a preventive method for preventing a reflected signal from being caused in a star connection to foster better understanding of this invention.

In FIG. 3, four transmission lines each of which has wiring impedance Z0 are connected to one another at a branch point through respective stab resistors each of which has resistance Rs. When attention is focused on one of the transmission lines, the remaining three transmission lines are regarded as branches diverged from the focused transmission line. That is, the star connection of FIG. 3 comprises a transmission line with three (N=3) branches.

A necessary and sufficient condition of no reflection at a point A is given by:

$$Z0=Rs(Rs+Z0)/3 \qquad (1).$$

The equation (1) is generalized as below.

$$Z0=Rs+(Rs+Z0)/N \qquad (2)$$

From the equation (2), the resistance Rs is found as below.

$$Rs=(N-1)\times Z0/(N+1) \qquad (3)$$

In the case of FIG. 3, the resistance Rs is equal to Z0/2 because N=3.

Thus, in the star connection of FIG. 3, a signal transmitted from any direction is not reflected at the branch point when the resistance Rs of the stab resistors satisfies the equation (3). That is, the transmission line having N of branches can be formed by adopting the resistance Rs found by using the equation (3).

Additionally, Japanese Unexamined Patent Publication No. 2001-84070 discloses a method for finding resistance of two stab resistors (N=2) in a transmission line having two branches. However, the method is not applicable to a case where the number of branches is equal to or more than three (N?3). Furthermore, the method is for a liquid crystal display panel and the publication does not suggest that it is applicable to a memory system, especially a high speed memory system. The method is on condition that termination resistors are not connected to ends of the wires and that reflection occurs at the ends of the wires. Furthermore, the method is impossible to be applied to the memory system because it fixes a characteristic impedance of one of the wires at first and then decides characteristic impedances of the remaining two wires and resistors.

Now, it is assumed that the above mentioned preventive method for preventing the reflected signal from occurring on the star connection is applied to a memory system having a plurality of memory modules connected to a memory controller in a stab connection. For example, the preventive method is used for an IO bus line in the memory system.

In the application, it is undesirable that stab resistors be provided on a motherboard. This is because the manufacturer of the motherboard generally prohibits alterations of the motherboard. That is, if the stab resistors are formed on the motherboard, it is impossible to exchange them for other resistors. There is a variety of needs of users regarding the number of the memory modules. To meet the needs, it is necessary to be able to change resistance of each stab resistor according to the number of the memory modules (or branches).

In addition, the number of elements on the motherboard is smaller and signal attenuation on the motherboard is suppressed when the stab resistors are not formed on the motherboard.

Therefore, it is necessary to suppress the signal reflection in the memory system without providing the stab resistors on the motherboard. This is achieved by the same method as that of suppressing the signal reflection on a star connection illustrated in FIG. 4. That is, a condition that there is no signal reflection at both points A and B of FIG. 4 should be found.

Figure 4:
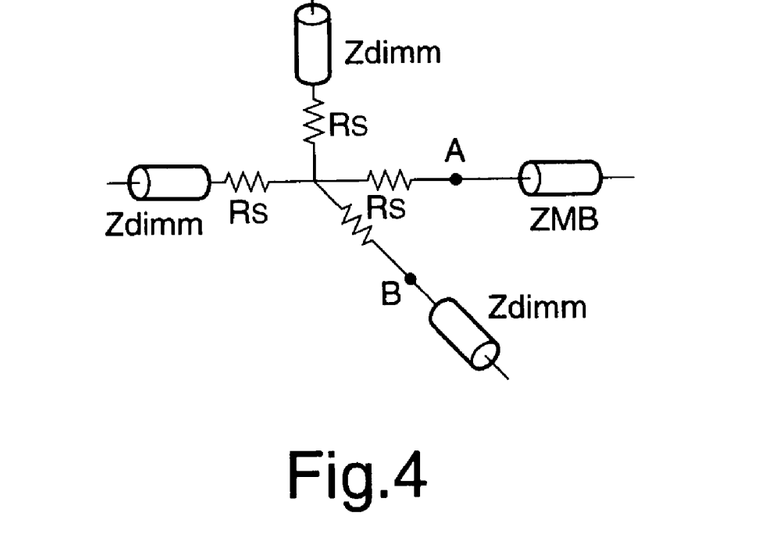
FIG. 4 is an equivalent circuit diagram for describing application of the theory of FIG. 3 to a memory system.

In FIG. 4, Zmb, Zdimm and Rs represent characteristic impedance of the motherboard, wiring impedance of each memory module and resistance of each stab resistor, respectively. A necessary and sufficient condition of no signal reflection at the point A is given by:

$$Zmb=(Rs+Zdimm)/N \qquad (4)$$

where N represents the number of branches. On the other hand, a necessary and sufficient condition of no signal reflection at the point B is given by:

$$Zdimm=Rs+\{Zmb\times(Rs+Zdimm)\}/\{(Rs+Zsimm)+Zmb\times(N-1)\} \qquad (5).$$

When the equation (4) is substituted in the equation (5), the characteristic impedance Zmb is eliminated as below.

$$Rs=(N-1)\times Zdimm/N \qquad (6)$$

Furthermore, when the equation (6) is substituted in the equation (4), the resistance Rs is eliminated as below.

$$Zmb=(2N-1)\times Zdimm/N^2 \qquad (7)$$

As understood from above mentioned equations (6) and (7), the resistance Rs and the characteristic impedance Zmb can be decided on the basis of the wiring impedance Zdimm and the number of the memory modules. By the use of the resistance Rs and the characteristic impedance Zmb decided as mentioned above, bi-directional transmission can be carried out between the motherboard and each memory module, which are connected to one another as illustrated in FIG. 4, without the signal reflection.

The star connection meeting the equations (6) and (7) is applicable to a unidirectional bus as a command address bus in the memory system. However, it is unnecessary to meet the equation (5) in such a case. That is, the equation (4) should be merely satisfied for the unidirectional bus.

Figure 5:
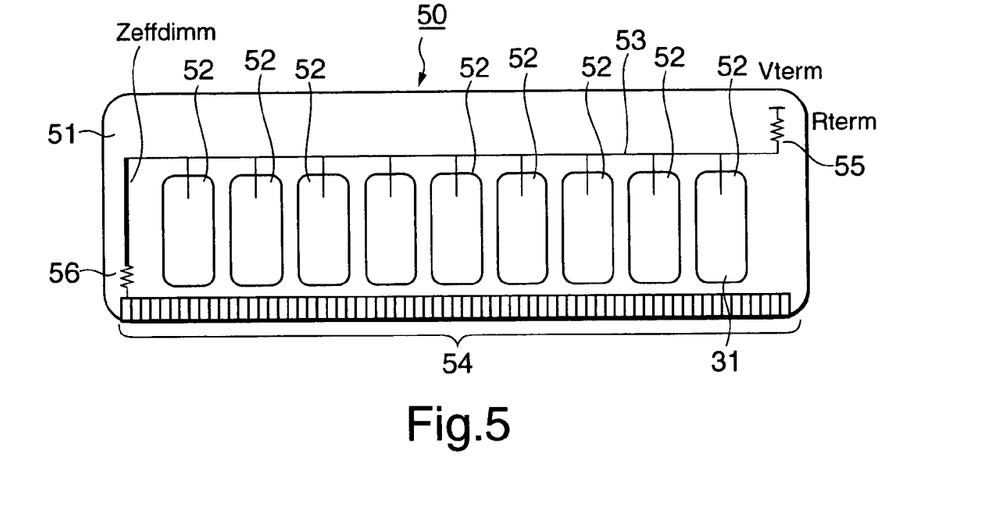
FIG. 5 is a schematic diagram of a memory module according to a preferred embodiment of this invention.
Figure 6:
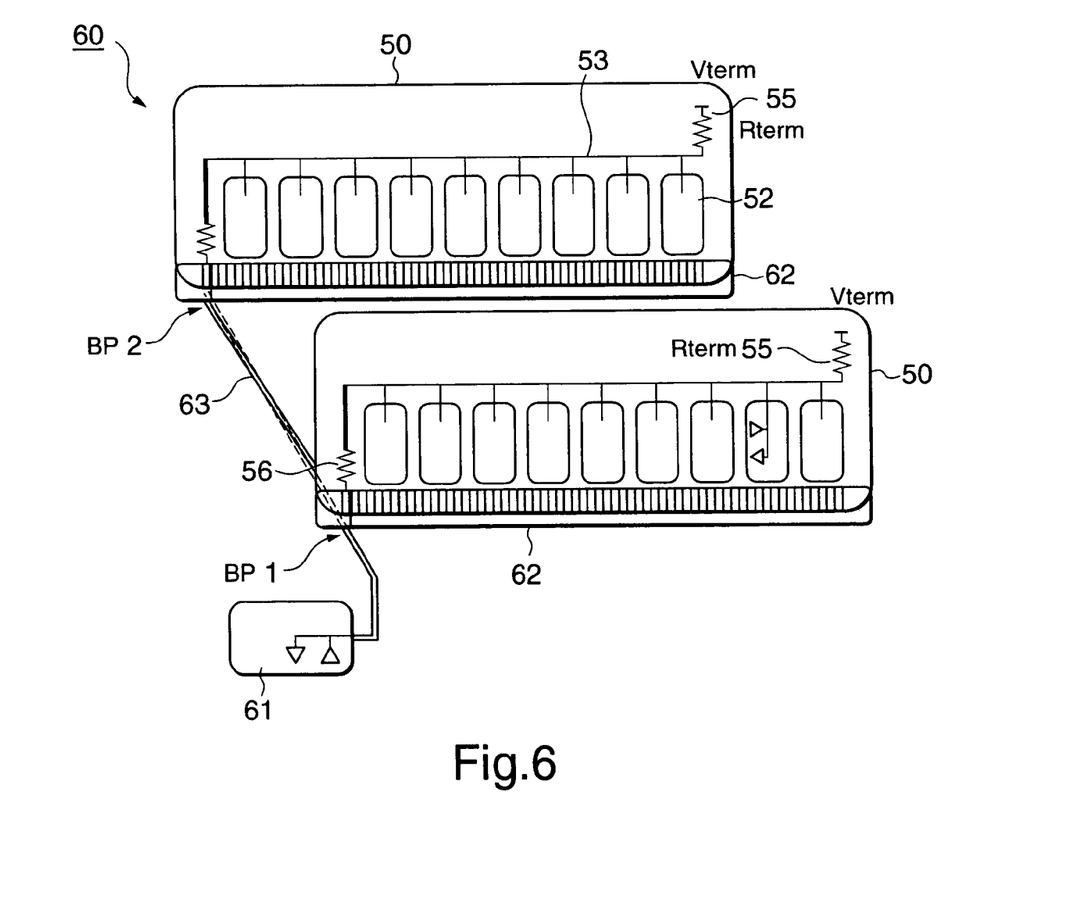
FIG. 6 is a schematic diagram of a memory system including two of the memory modules of FIG. 5.
Figure 7:
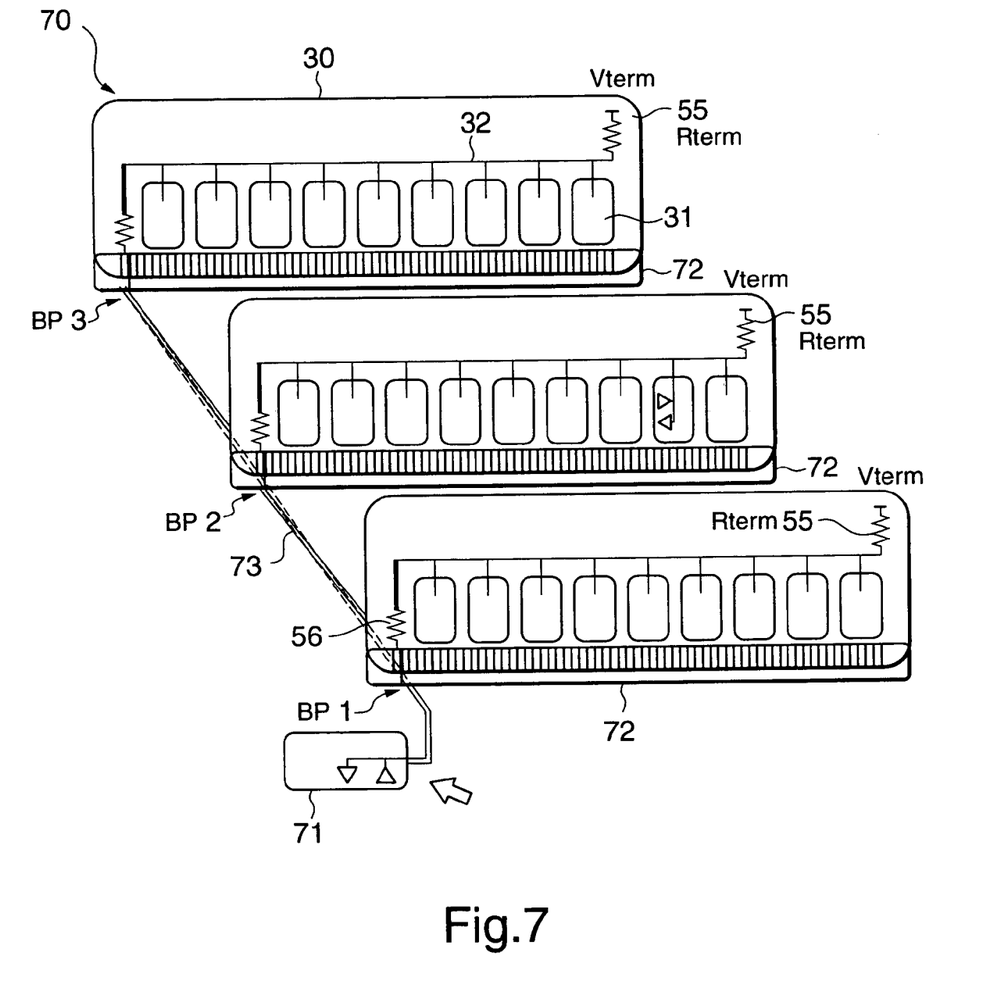
FIG. 7 is a schematic diagram of a memory system including three of the memory modules of FIG. 5.

Referring to FIGS. 5 to 7, the description will proceed to a memory module according to a preferred embodiment of this invention and to memory systems using the memory modules.

In FIG. 5, the memory module 50 comprises a memory board 51, nine memory chips 52, a module transmission bus line 53, a plurality of pins 54, a terminating resistor (Rterm) 55, and a stab resistor (Rs) 56.

The memory board 51 is a printed circuit board. The memory chips 52 are mounted on the memory board 51 at regular intervals and commonly connected to the module transmission bus line 53 between both ends thereof. The pins 54 are formed at one edge of the memory board 51 to be inserted into and held by a slot of a connector (see FIG. 6) formed on a motherboard (not shown). When the pins 54 are inserted into the slot of the connector, they are electrically connected to terminals of the connector. The terminating resistor 55 is connected to one end of the module transmission bus line 53 at its end and supplied with a predetermined terminating voltage level Vterm at its other end. The stab resistor 56 is connected between the other end of the module transmission bus line 53 and one of the pins 54.

FIG. 6 shows one of the memory systems comprising two of the memory modules 50 of FIG. 5 while FIG. 7 shows the other one of memory systems comprising three of the memory modules 50 of FIG. 5.

In FIG. 6, the memory system 60 comprises a motherboard (not shown), a memory controller 61, two connectors 62 and a motherboard transmission bus line 63. The memory controller 61 and the connectors 62 are mounted on the motherboard. The connectors 62 are used for receiving the memory modules 50. The motherboard transmission bus line 63 is formed on the motherboard to connect the connectors 62 with the memory controller 61 in a stab connection. The motherboard transmission bus line 63 has two branch points BP1 and BP2 connected to the connectors 62.

Similarly, the memory system 70 of FIG. 7 comprises a motherboard (not shown), a memory controller 71, three connectors 72, and a motherboard transmission bus line 73. The memory controller 71 and the connectors 72 are mounted on the motherboard while the motherboard transmission bus line 73 is formed on the motherboard to connect the connectors 72 with the memory controller 71 in a stab connection. The motherboard transmission bus line 73 has three branch points BP1, BP2 and BP3 connected to the connectors 72.

In each of the memory systems 60 and 70, the module transmission bus lines 53 or 32 and the motherboard transmission bus line 63 or 73 is used for an IO bus line (or a bi-directional bus). Each of the memory chips 51 comprises a driver and a receiver connected to the IO bus line. Each of the memory controllers 61 and 71 similarly comprises a driver and a receiver connected to the IO bus line. In FIG. 6, two sets of the driver and the receiver are designated by small triangles in the memory controller 61 and one of the memory chips 52. Similarly, FIG. 7 shows other two sets of the driver and the receiver with small triangles.

The memory module 50 has a memory chip arrangement portion which consists of the memory chips 52 and the module transmission bus line 53. The memory chip arrangement portion has effective impedance Zeffdimm (corresponding to the Zdimm of FIG. 4). Here, it is assumed that the module transmission bus line 53 has wiring impedance of Z0 ($=\sqrt{L/C}$) [Ω], an interval between adjacent two memory chips 52 is represented by X [m], and input capacitance is represented by Cin [F]. Then the effective impedance Zeffdimm of the memory chip arrangement portion is given by:

$$Zeffdimm=\sqrt{L/(C+Cin/X)}.$$

For instance, the effective impedance Zeffdimm is approximately equal to 39.3[Ω] when Z0=60[Ω] (L=3.6×10⁻⁷[H/m], C=1.0×10⁻¹⁰[F/m]), X=12×10⁻³[m], and Cin=1.6×10⁻¹²[F]. Moreover, the effective impedance Zeffdimm is approximately equal to 43.3[Ω] when Z0=60[Ω] (L=3.6×10⁻⁷[H/m], C=1.0×10⁻¹⁰[F/m]), X=13×10⁻³[m], and Cin=1.2×10⁻¹²[F].

The terminating resistor 55 in the memory module 50 has resistance Rterm which is decided to be equivalent to the effective impedance Zeffdimm.

The stab resistor 56 has the resistance Rs given by the same equation as the equation (6). That is the resistance Rs of the resistor 56 is given by:

$$Rs=\{(N-1)/N\}\times Zeffdimm.$$

For instance, the resistance Rs is as follows when N=2 and Zeffdimm=39.3[Ω].

$$Rs = \{(N-1)/N\} \times Zeffdimm$$
$$= (1/2) \times 39.3$$
$$= 19.7[\Omega]$$

In this case, the wiring impedance Zmb of the motherboard is given by the same equation as the equation (7). That is, the wiring impedance Zmb is given by:

$$Zmb = (2N-1)Zeffdimm/N^2$$
$$= 3 \times 39.3/4$$
$$= 29.5[\Omega].$$

Figure 8:
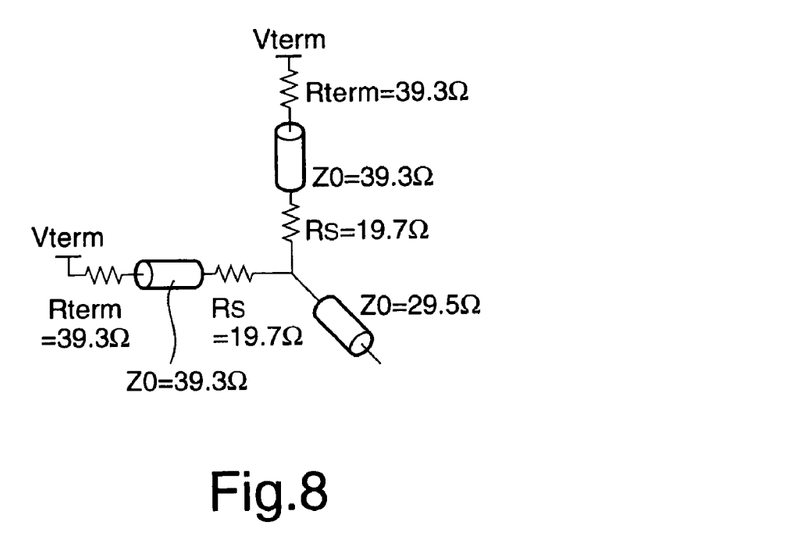
FIG. 8 is an equivalent circuit diagram of the memory system of FIG. 6.

FIG. 8 shows a schematic diagram of the memory system having the characteristic impedance Zeffdimm, the resistance Rs and the wiring impedance Zmb which are decided as mentioned above.

Figure 9:
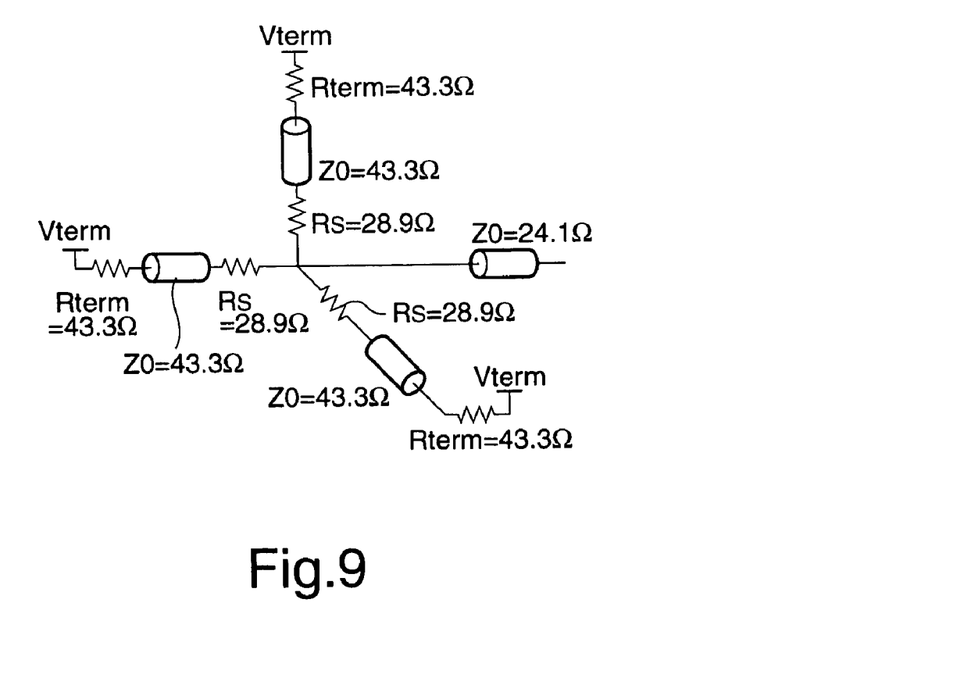
FIG. 9 is an equivalent circuit diagram of the memory system of FIG. 7.

With regard to the memory system of FIG. 7, the resistance Rs of the stab resistor 56 and the wiring impedance Zmb of the motherboard are similarly found. For instance, Rs=28.9[Ω] and Zmb=24.1[Ω] when N=3 and Zeffdimm=43.3[Ω]. These are illustrated in FIG. 9.

The memory systems shown in FIGS. 6 and 7 can stably operate faster than an existing memory system called DDR-I (operating frequency: 133 MHz) or DDR-II (operating frequency: 266 MHz). For example, the operating frequency of the memory systems is over 300 MHz. This is because no signal reflection occurs at any of the branch points and end portions.

Furthermore, each of memory systems of FIGS. 6 and 7 does not need a stab resistor on the motherboard. Accordingly, the motherboard has a small number of elements and broad spaces for wiring. In addition, there is no attenuation of transmission signal on the motherboards in the memory systems of FIGS. 6 and 7. Additionally, the structure of the memory systems of FIGS. 6 and 7 allows a multi-slot system to be formed without a large increase of wires on the motherboard.

Figure 10:
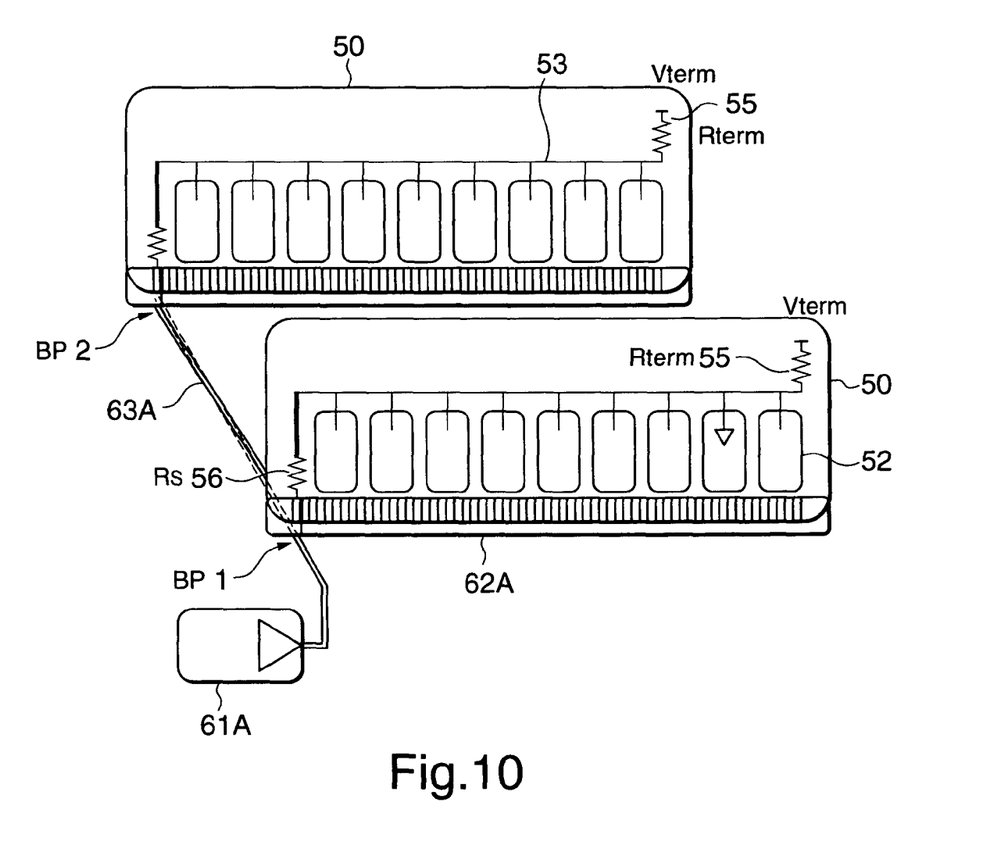
FIG. 10 is a schematic diagram of a modification of FIG. 6.
Figure 11:
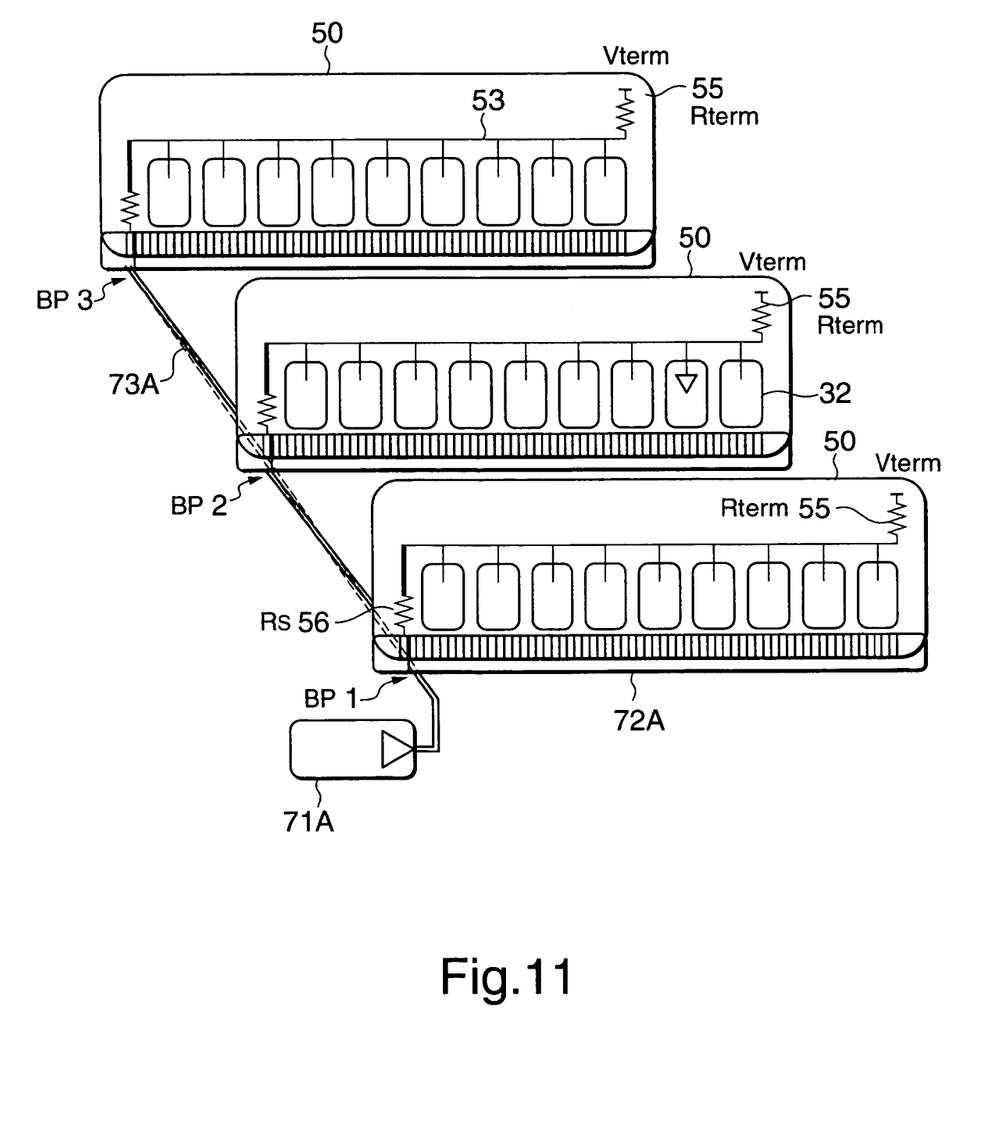
FIG. 11 is a schematic diagram of a modification of FIG. 7.

Though the above description concerns applying this invention to the bi-directional bus as the IO bus of the memory system, this invention is applicable to an unidirectional bus as a command address bus of the memory system as illustrated in FIG. 10 or 11. In such a case, the wiring impedance Zmb of the motherboard, the stab resistance Rs and the effective impedance Zeffdimm can be found by the use of the equations (6) and (7). However, they may be found by the use of the equation (4).

For instance, it is assumed that Zeffdimm=39.3[Ω] and Zmb=30[Ω] for the memory system of FIG. 10. From the equation (4), the stab resistance Rs is given by:

$$Rs = N \times Zmb - Zeffdimm$$
$$= 2 \times 30 - 39.3$$
$$= 20.7[\Omega].$$

On the other hand, it is assumed that Zeffdimm=43.3[Ω] and Zmb=30[Ω] for the memory system of FIG. 11. The stab resistance Rs is given by:

$$Rs = 3 \times 30 - 43.3$$
$$= 46.7[\Omega].$$

Figure 12:
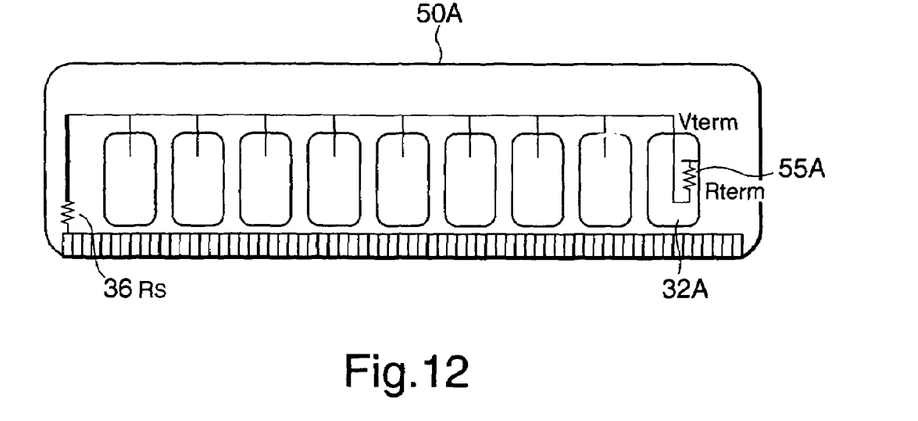
FIG. 12 is a schematic diagram of a modification of FIG. 5.

Though the terminating resistor 55 is formed at the outside of the memory chips 52 on the memory board 51, the terminating resistor 55 A may be formed in the one of memory chips 32A as illustrated in FIG. 12. This is known as a technique called "On Die Termination".

Figure 13:
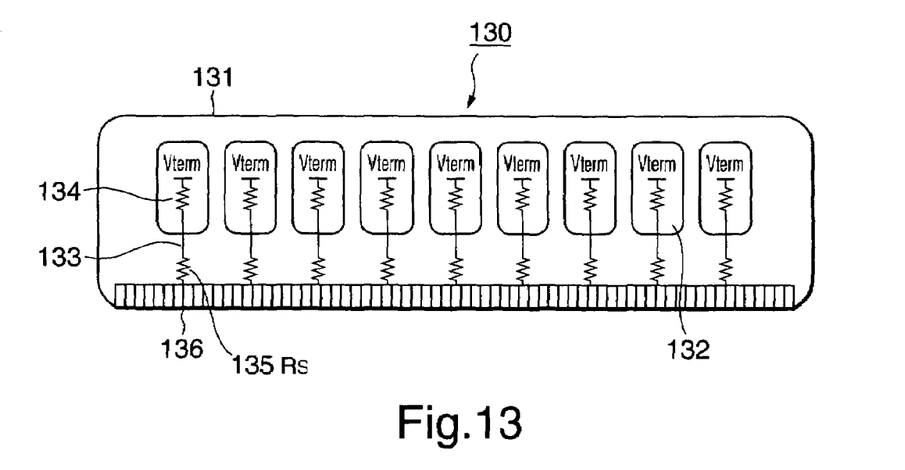
FIG. 13 is a schematic diagram of a memory module according to another embodiment of this invention.
Figure 14:
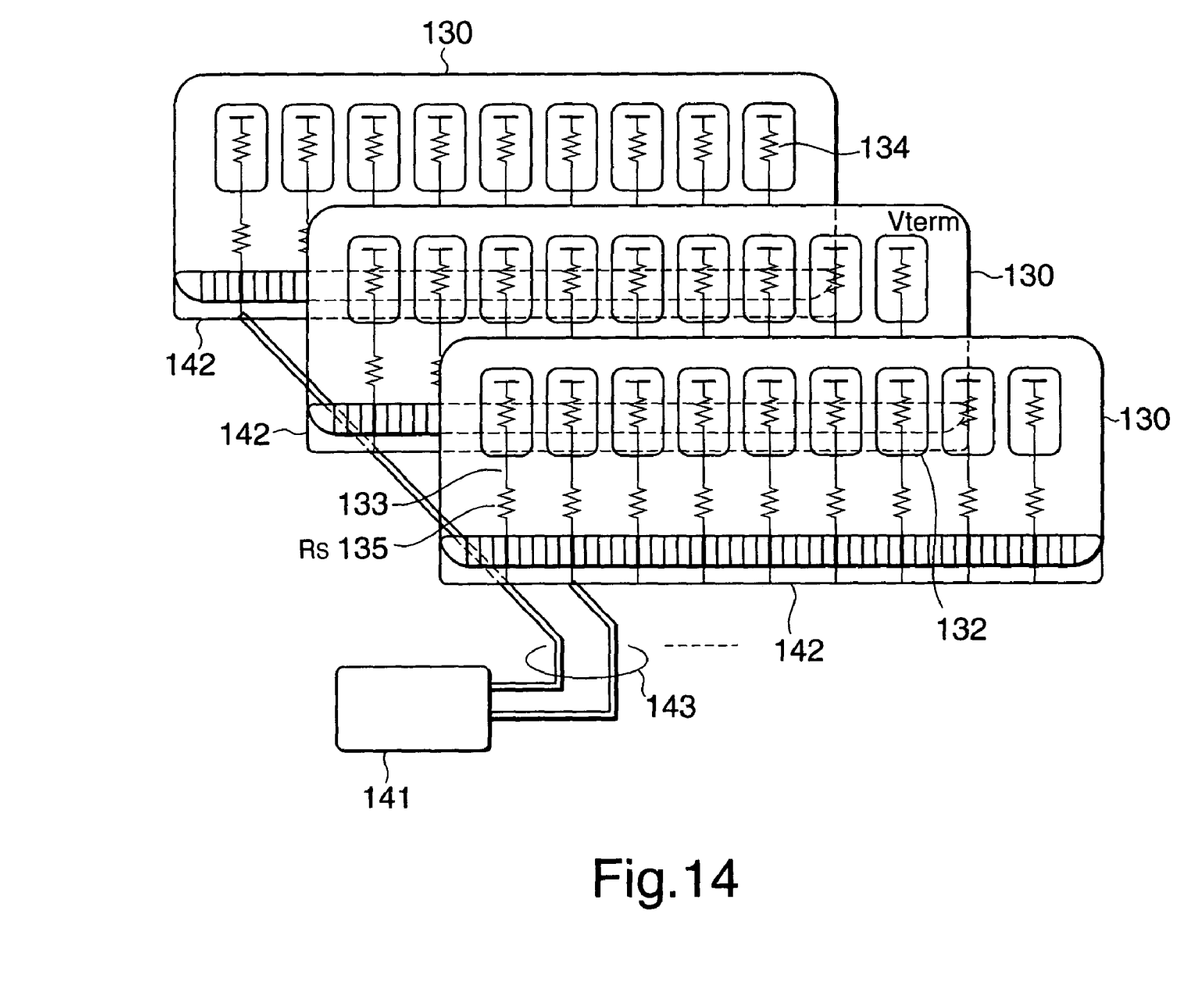
FIG. 14 is a schematic diagram of a memory system including three of the memory modules of FIG. 13.
Figure 15:
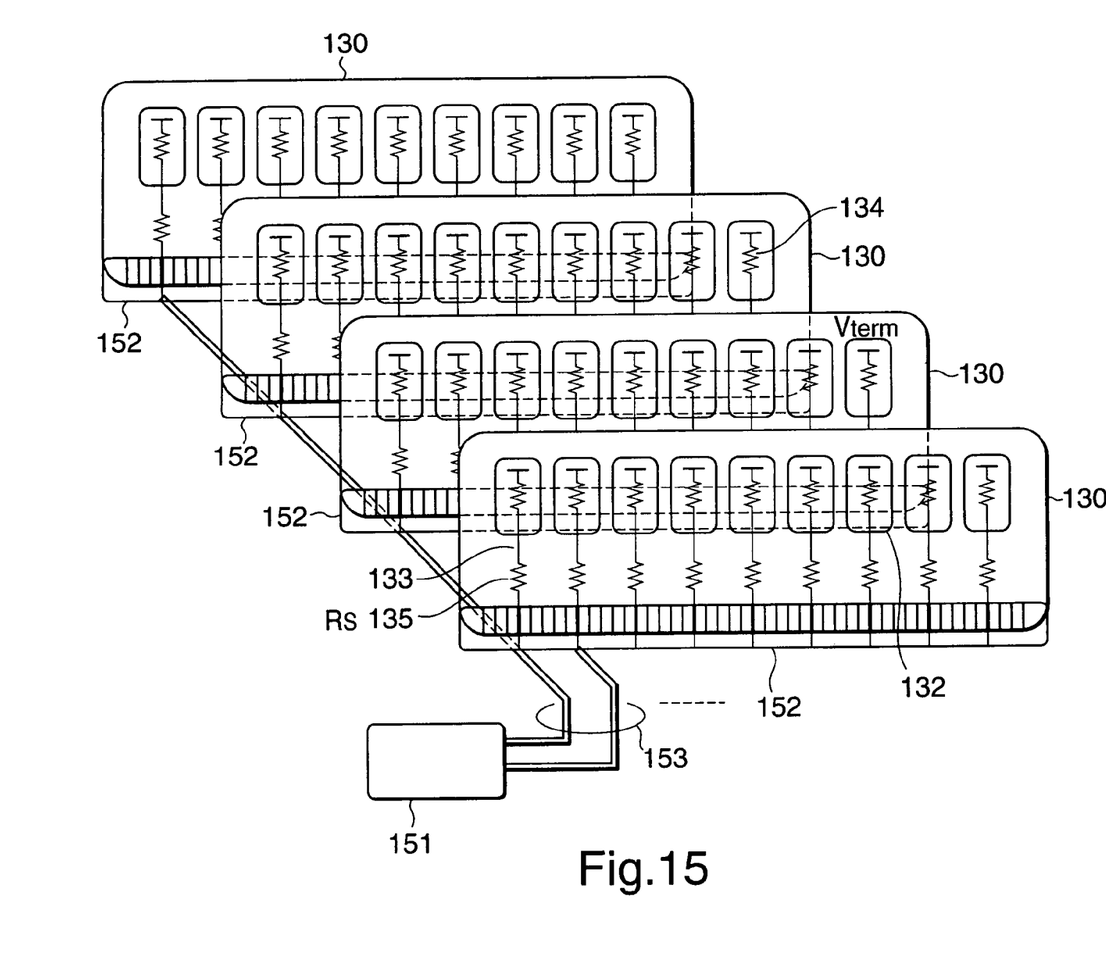
FIG. 15 is a schematic diagram of a memory system including four of the memory modules of FIG. 13.

Next, referring to FIGS. 13 to 15, a description follows regarding a memory module according to another embodiment of this invention and about memory systems using the memory modules.

In FIG. 13, the memory module 130 comprises a memory board 131, nine memory chips 132, module IO bus lines 133, terminating resistors 134, stab resistors 135, and pins 136.

The memory board 131 is a printed circuit board. The memory chips 132 are mounted on the memory board 131 at regular intervals. The module IO bus lines 133 are formed on the memory board 131 to be connected to the memory chips 132, respectively. The terminating resistors 134 are formed in the memory chips 132 and connected to ends of the memory bus lines 133, respectively. The stab resistors 135 are formed on the memory board to be connected to other ends of the module 10 bus lines 133, respectively. The pins 136 are formed at the edge of the memory board 131. Each of the stab resistors 135 is also connected to a corresponding one of the pins 135.

FIG. 14 shows the memory system using three of the memory modules 130 of FIG. 13 while FIG. 15 shows the memory system using four of the memory modules 130 of FIG. 13.

In FIG. 14, the memory system comprises a motherboard (not shown), a memory controller 141, three connectors 142 and nine motherboard IO bus lines 143.

The memory controller 141 is formed on the motherboard. The connectors 142 are mounted on the motherboard to receive the memory modules of FIG. 13. The motherboard IO bus lines 143 are formed on the motherboard to be connected to the connectors 142. The motherboard IO bus lines 143 are corresponding to the memory chips 132 of each memory module 130 respectively. Each of the motherboard IO bus lines 143 connects corresponding memory chips on the memory modules 130 with one another. That is, according to this embodiment, not memory modules but memory chips are connected to one another in a stab connection.

In this embodiment, bi-directional transmission can be carried out without signal reflection between the memory controller and each memory chip if resistance of the terminating resistors 134 and the stab resistors 135 are found by the use of the equations (6) and (7). However, the effective impedance Zeffdimm depends on the memory chip 132 and the module IO bus line 133 connected to the memory chip 132.

The memory system of FIG. 15 is similar to that of FIG. 14 except for the number of the memory modules 130. That is, the memory system comprises a memory controller 151, four connectors 152 and nine motherboard IO bus lines 153.

Because the memory systems of FIGS. 14 and 15 differ in the number of the memory modules 130, they also differ in the stab resistance Rs.

The memory systems shown in FIGS. 14 and 15 can stably operate faster than the existing memory system like the memeory systems of FIGS. 6 and 7. Furthermore, it is necessary to form a stab resistor on each motherboard of the memory systems of FIGS. 14 and 15.

Figure 16:
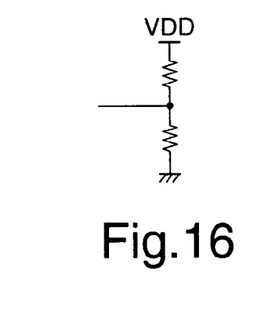
FIG. 16 is an example of terminating of a module transmission bus line in the memory module of FIG. 5 12, or 13.

In each of the above mentioned embodiments, the terminating resistors are connected to the predetermined voltage level Vterm. The predetermined voltage level may be obtained by dividing power supply voltage VDD as shown in FIG. 16.

While this invention has thus far been described in conjunction with the few embodiments thereof, it will readily be possible for those skilled in the art to put this invention into practice in various other manners. For example, the number of the connectors on the motherboard may be more than four.

What is claimed is:

1. A memory module for insertion in any one of connectors formed on a motherboard, the module comprising:
a memory chip;
a pin configured and positioned to engage with the connector;
a bus which connects said memory chip to said pin;
a terminating resistor connected to one end of said bus, and
a stab resistor connected between said pin and the other end of said bus;
said connectors being connected to a memory controller in a stab connection style, said stab resistor and said terminating resistor having stab resistance Rs and terminating resistance Rterm, respectively, wherein
said stab resistance Rs and said terminating resistance Rterm are given by:

$Rs=(N-1) \times Zeffdimm/N$, and

Rterm =Zeffdimm where N represents the number of said connectors; and Zeffdimm represents the effective impedance of a memory chip arrangement portion consisting of said bus and said memory chip.

2. A memory module as claimed in claim 1 further comprising other memory chips, wherein said bus is connected to all of the memory chips in common.

3. A memory module as claimed in claim 1 further comprising other memory chips, other pins corresponding to said other memory chips respectively, and other buses for connecting said memory chips to said other pins severally.

4. A memory module as claimed in claim 1, wherein said bus comprises a bi-directional bus.

5. A memory module as claimed in claim 1, wherein said bus comprises a unidirectional bus.

6. A memory module as claimed in claim 1, wherein terminating resistor is formed in said memory chip.

7. A memory system including a plurality of memory modules inserted in connectors formed on a motherboard, wherein each memory module comprises:
a memory chip;
a pin configured and positioned to engage with one of said connectors;
a bus which connects said memory chip to said pin;
a terminating resistor connected to one end of said bus, and
a stab resistor connected between said pin and the other end of said bus;
said connectors being connected to a memory controller in a stab connection style on a motherboard, said stab resistor and said terminating resistor having stab resistance Rs and terminating resistance Rterm, respectively, wherein
said stab resistance Rs and said terminating resistance Rterm are given by:

$Rs=(N-1) \times Zeffdimm/N$, and

Rterm=Zeffdimm where N represents the number of said memory modules; and Zeffdimm represents the effective impedance of a memory chip arrangement portion consisting of said bus and said memory chip, and wherein
said mother board has wiring impedance Zmb represented by:

$Z=(2N-1) \times Zeffdimm$.

8. A memory system as claimed in claim 7, wherein each of said memory modules further comprises other memory chips, and said bus is connected to all of the memory chips in common in each of said memory modules.

9. A memory system as claimed in claim 7, each of said memory modules further comprising other memory chips, other pins corresponding to said other memory chips respectively, and other buses for connecting said memory chips to said other pins severally.

10. A memory system as claimed in claim 7, wherein said bus comprises a bi-directional bus.

11. A memory system as claimed in claim 7, wherein said bus comprises a unidirectional bus.

12. A memory system including a plurality of memory modules inserted in connectors formed on a motherboard, wherein each memory module comprises:
a memory chip;
a pin configured and positioned to engage with one of said connectors;
a bus which connects said memory chip to said pin;
a terminating resistor connected to one end of said bus, and
a stab resistor connected between said pin and the other end of said bus,
wherein said bus comprises a unidirectional bus; and
wherein said connectors are connected to said memory controller in stab connection style, said stab resistor and said terminating resistor having stab resistance Rs and terminating resistance Rterm, respectively, wherein
said stab resistance Rs and said terminating resistance Rterm meet an equation of:

$Zmb=Rs+Zeffdimm)/N$ where Zmb represents wiring impedance of said motherboard; Zeffdimm represents the effective impedance of a memory chip arrangement portion consisting of said bus and said memory chip; and N, the number of said memory modules.

* * * * *